(12) United States Patent
Zhang et al.

(10) Patent No.: US 8,619,436 B2
(45) Date of Patent: *Dec. 31, 2013

(54) ELECTRICAL COMPONENT AND METHOD FOR MAKING THE SAME

(75) Inventors: Hong-Bo Zhang, Kunshan (CN); Zheng-Hua Xu, Kunshan (CN); Chao-Tung Huang, Tu-cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 142 days.

This patent is subject to a terminal disclaimer.

(21) Appl. No.: 13/115,087

(22) Filed: May 24, 2011

(65) Prior Publication Data

US 2011/0222250 A1     Sep. 15, 2011

Related U.S. Application Data

(63) Continuation of application No. 12/077,761, filed on Mar. 21, 2008, now Pat. No. 7,948,771.

(30) Foreign Application Priority Data

Mar. 21, 2007 (CN) .......................... 2007 1 0020750

(51) Int. Cl.
    *H05K 7/00*      (2006.01)
    *H01F 27/02*    (2006.01)
(52) U.S. Cl.
    CPC ................................... *H01F 27/027* (2013.01)
    USPC .......................................... 361/821; 174/520
(58) Field of Classification Search
    CPC ..................................................... H01F 27/027
    USPC ................... 361/821, 809, 807, 836; 174/520
    See application file for complete search history.

(56) References Cited

U.S. PATENT DOCUMENTS

| | | | | |
|---|---|---|---|---|
| 6,133,525 A | * | 10/2000 | Yang et al. | 174/552 |
| 6,225,560 B1 | * | 5/2001 | Machado | 174/556 |
| 6,297,721 B1 | | 10/2001 | Lu et al. | |
| 6,344,785 B1 | * | 2/2002 | Lu et al. | 336/96 |
| 6,642,827 B1 | * | 11/2003 | McWilliams et al. | 336/107 |
| 6,912,781 B2 | * | 7/2005 | Morrison et al. | 29/854 |
| 7,326,084 B1 | * | 2/2008 | Chen et al. | 439/620.23 |
| 7,948,771 B2 | * | 5/2011 | Zhang et al. | 361/809 |
| 2004/0239567 A1 | | 12/2004 | Van Der Poel | |

FOREIGN PATENT DOCUMENTS

| | | |
|---|---|---|
| CN | 2247883 | 2/1997 |
| CN | 2505964 | 8/2002 |

* cited by examiner

*Primary Examiner* — Yuriy Semenenko
(74) *Attorney, Agent, or Firm* — Wei Te Chung; Mien Chieh Chang

(57) ABSTRACT

An electrical component (100) includes a housing (1), a number of terminals (2) molded within housing and at least one electrical element (3). The housing has at least a side wall (11) having a number of recesses (112) and an internal cavity (15). Each terminal has a first end (23) extending to a bottom of the side wall and formed with a platform portion (231) located onto the bottom of the side wall and aligned with the corresponding recess. The electrical element has a number of wires (321) wrapped thereon. One end of the wire extends outward the cavity through the recess and is soldered onto the corresponding platform portion.

175

3 Claims, 5 Drawing Sheets

ELECTRICAL COMPONENT AND METHOD FOR MAKING THE SAME

This application is a continuation application of U.S. Pat. No. 7,948,771 to be issued on May 24, 2011.

BACKGROUND OF THE INVENTION

1. Field of the Invention

The present invention relates to an electrical component having a plurality of electrical elements adapted for being soldered onto a plurality of terminals and a method for producing the same.

2. Description of Prior Arts

U.S. Pat. No. 5,656,985 issued on Aug. 12, 1997 discloses an electronic component comprising a housing having a plurality of side walls, an open bottom and a cavity defined therebetween, a plurality of electrical elements located within the cavity and a plurality of pins molded into the side walls of the housing. The electrical element has a plurality of wires wrapped thereon. Each of the pins has a notched post upon which the wire is wound.

However, during assembling, it is difficult and time consuming to wind the wire upon the notched post.

Hence, it is desirable to provide an improved electrical element to overcome the aforementioned disadvantages.

SUMMARY OF THE INVENTION

An object of the present invention is to provide an electrical component comprising a number of terminals and at least an electrical element having a plurality of wires effectively connected with the corresponding terminals. Another object of the present invention is to provide a method of easily assembly the electrical component.

To achieve the above object, an electrical component comprises a housing, a plurality of terminals embeded within housing and at least one electrical element. The housing has a top wall, at least a side wall having a plurality of recesses, an open bottom and an internal cavity. Each terminal has a first end extend to a bottom of the side wall and formed with a platform portion located onto the bottom of the side wall and aligned with corresponding recess. The electrical element comprises a plurality of wires wrapped thereon. One end of the wire extends through the recess and is soldered onto the corresponding platform portion.

During assembly, it is easy to solder the wires of electrical element onto the terminals if only locating the ends of the wires on the corresponding platform portions of the terminals.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
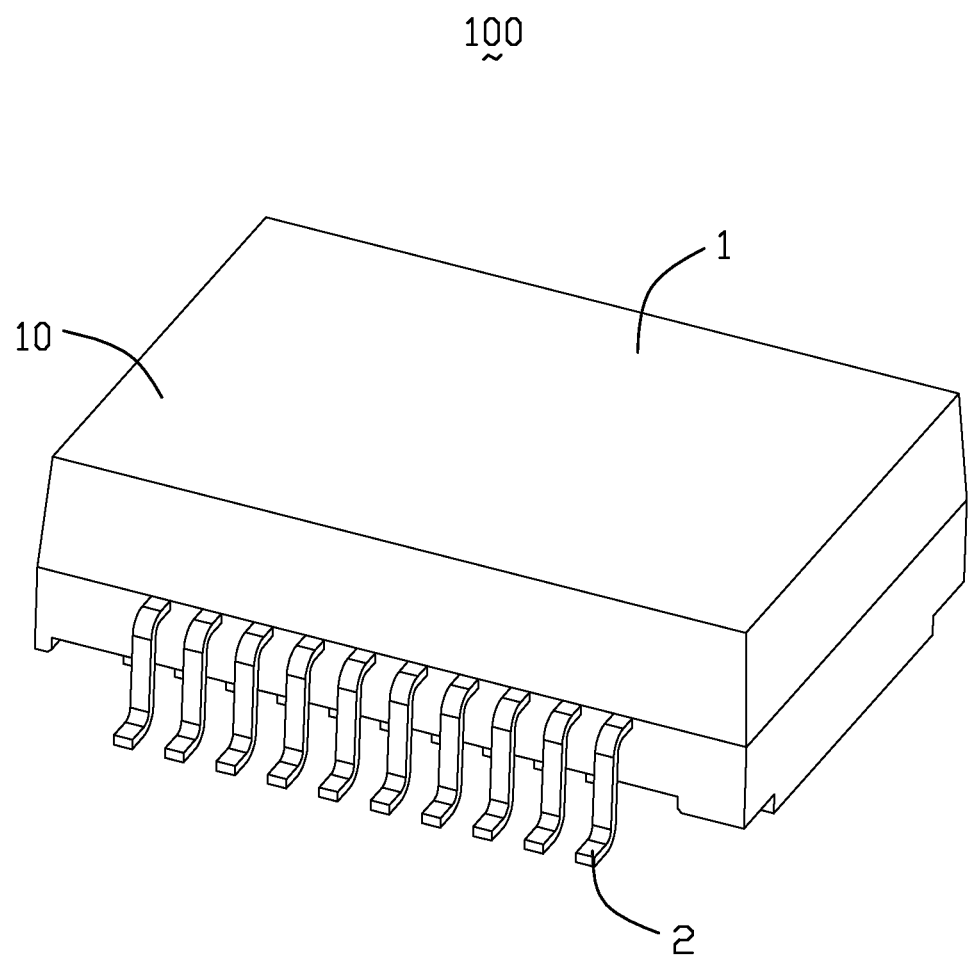
FIG. 1 is a perspective view of an electrical component in accordance with the present invention.

Reference will now be made to the drawing figures to describe the present invention in detail. Referring to FIG. 1-5, an electrical component 100 in accordance with the present invention comprises a housing 1, a plurality of terminals 2 embeded within the housing 1 and a number of electrical elements 3. Each electrical elements 3 has a plurality of wires 32 wrapped thereon.

Figure 2:
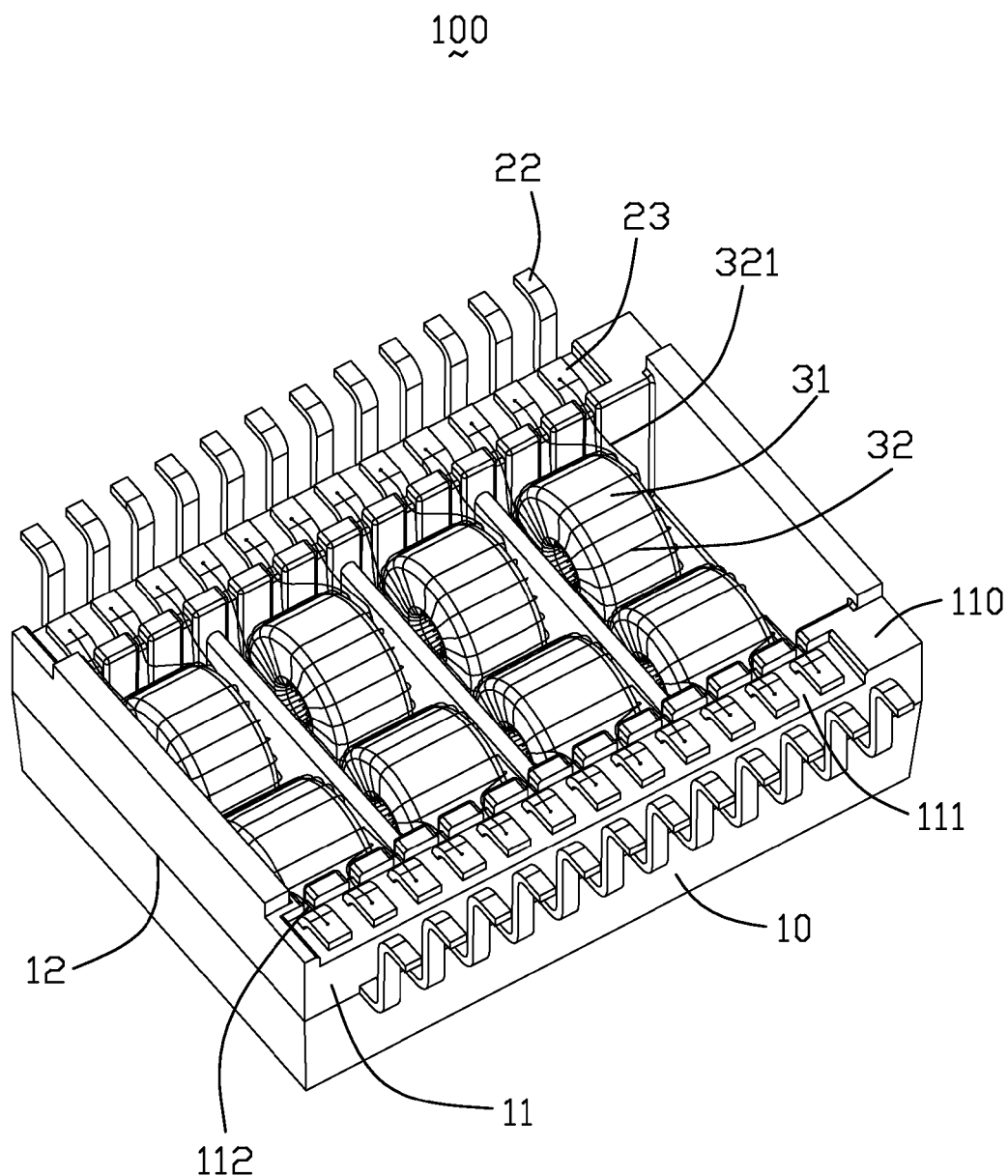
FIG. 2 is perspective view of the electrical component, taken from another aspect.
Figure 3:
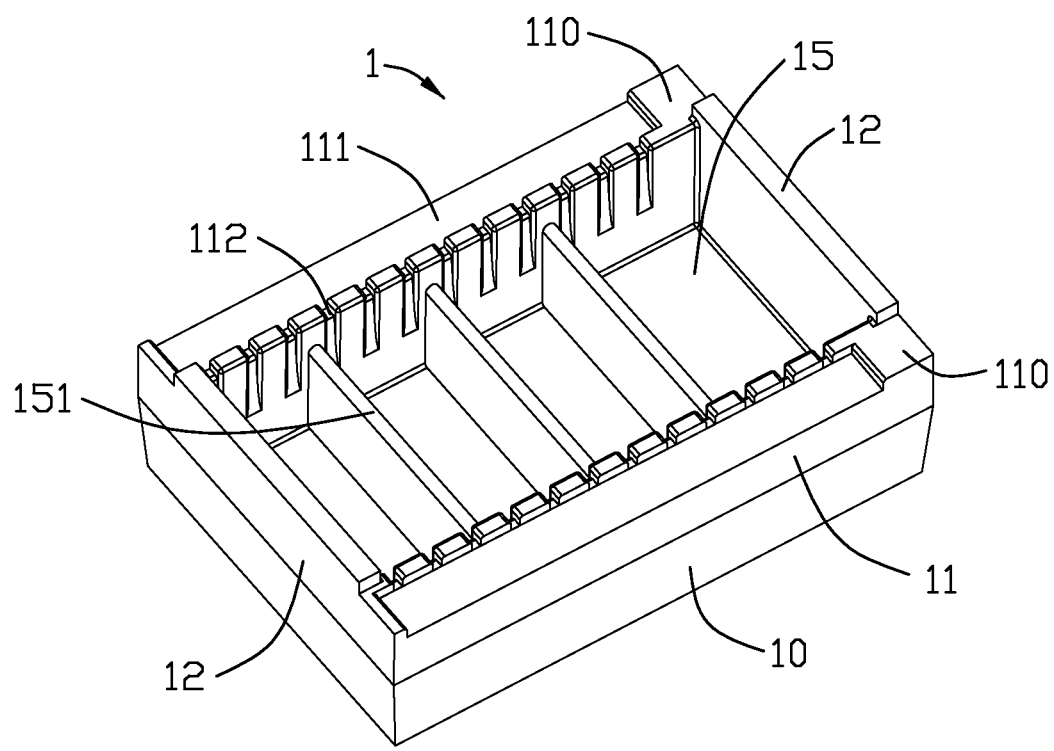
FIG. 3 is a perspective view showing a housing of the electrical component.

Referring to FIGS. 2 and 3, the housing 1 has a top wall 10, a pair of opposite side walls 11, 12, an open bottom (not labeled), a plurality of internal walls 151 forming a number of divided internal cavities 15 for receiving the electrical elements 3. A bottom surface 110 of the side wall 11 is provided with a depressed portion 111 and has a plurality of recesses 112 defined thereon. The side wall 11 has a plurality of protrusions (not labeled) extending downwardly from the bottom surface 110 of the side wall 11. The recesses 112 are defined between the protrusions.

Figure 4:
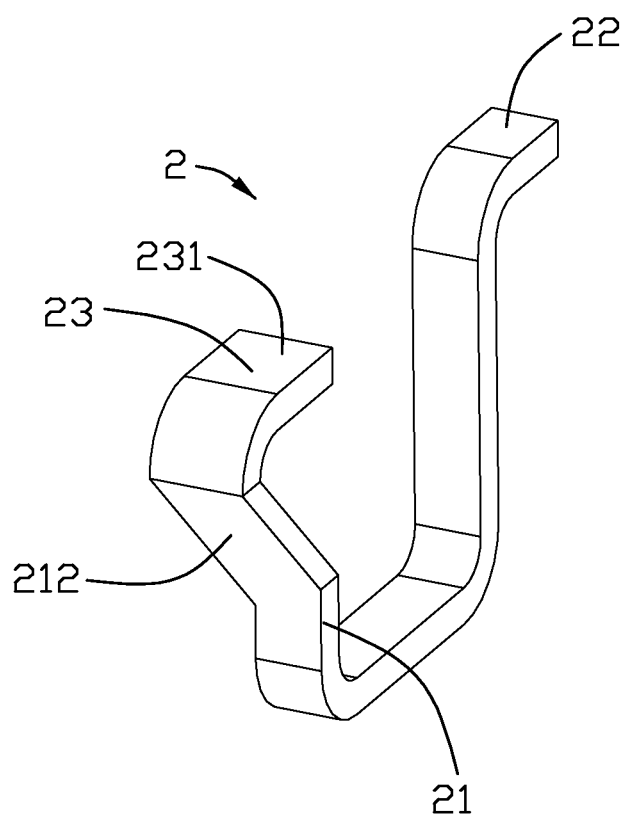
FIG. 4 is a perspective view showing a terminal of the electrical component.
Figure 5:
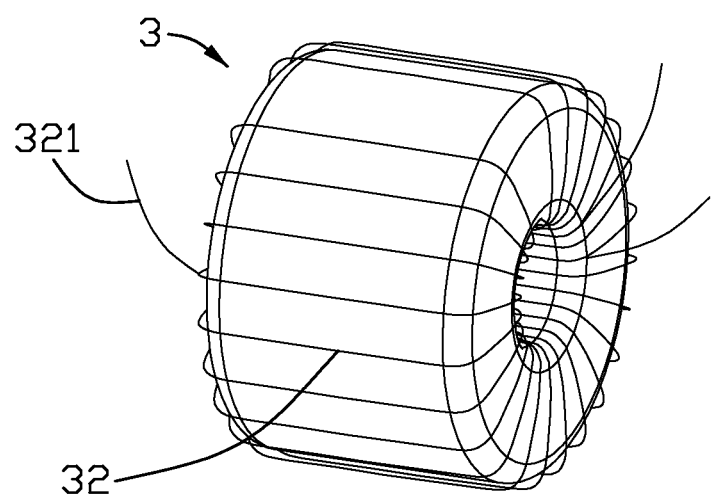
FIG. 5 is a perspective view showing an electrical element of the electrical component.

Referring to FIGS. 2 and 4, the terminals 2 are molded within the side walls 11 and each terminal 2 has a first end 23 extending along a bottom of said side walls 11, a second end 22 extending outwardly form the side wall 11 and a holding portion 21 molded within the housing 1. The holding portion 21 has a bending portion 212 extending obliquely upwardly. The first end 23 bends from the bending portion 212 and forms a platform portion 231 located on the depressed portion 111 of the side wall 11 and aligned with corresponding recess 112. The width of the platform portion 231 of the first end 23 is greater than the width of the second end 22 and the holding portion 21. The platform portion 231 of the first end 23 is not in alignment with the second end 22.

Referring to FIGS. 1-5, in assembling the electrical component 100, firstly, the terminals 2 are assembled to the side wall 11 of housing 1 by insert molding. Secondly, said electrical elements 3 are mounted within said internal cavities 15 of housing 1. Thirdly, one end of wire 321 is routed through the recess 111 of the side wall 11 and located onto the platform portion 231 of the terminal 2. Finally, the ends 321 of the wires 32 are soldered to the platform portions 231 of the terminals 2.

In accordance with the present invention, the electrical elements 3 are magnetic cores. Understandably, the electrical element 3 could be made from other material.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical component, comprising:
    an insulative housing defining a plurality of side walls commonly defining an interior cavity therein;
    a plurality of terminals held in the side walls, each of said terminals defining a horizontally extending platform portion which is hidden on an underside of the corresponding side wall, and an outer end which is exposed outside of the housing; and an electronic components disposed in the interior cavity with wires wound thereon, wherein one outer end of each of wires is securely seated to an undersurface of the platform portion.

2. The electrical component as claimed in claim 1, wherein each side wall defines a depression in an underside to receive the corresponding platform portions.

3. The electrical component as claimed in claim 2, wherein the underside of the side wall defines a plurality of recesses in alignment with the corresponding platform portions, respectively, so as to allow the outer ends of the corresponding wires to guidably extend therethrough to reach the corresponding platform portions, respectively.

* * * * *